United States Patent
Masumori

(10) Patent No.: US 8,214,730 B2
(45) Date of Patent: Jul. 3, 2012

(54) SYSTEM AND METHOD FOR DIGITAL SIGNAL TRANSMISSION WITH REDUCED ERROR RATE

(75) Inventor: Kenta Masumori, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 1096 days.

(21) Appl. No.: 12/028,541

(22) Filed: Feb. 8, 2008

(65) Prior Publication Data

US 2008/0195923 A1    Aug. 14, 2008

(30) Foreign Application Priority Data

Feb. 9, 2007  (JP) ................................ 2007-030453

(51) Int. Cl.
*G06F 7/02*    (2006.01)
(52) U.S. Cl. ...................................................... 714/821
(58) Field of Classification Search .................... 714/821
See application file for complete search history.

(56) References Cited

U.S. PATENT DOCUMENTS

| | | | | |
|---|---|---|---|---|
| 6,128,333 A * | 10/2000 | Kinoshita et al. | ............. | 375/147 |
| 2003/0090590 A1 | 5/2003 | Yoshizawa et al. | | |
| 2006/0190803 A1* | 8/2006 | Kawasaki et al. | ............. | 714/821 |
| 2006/0220725 A1* | 10/2006 | Cohen et al. | ................... | 327/524 |

FOREIGN PATENT DOCUMENTS

| | | |
|---|---|---|
| JP | H4-215333 A | 8/1992 |
| JP | 2003-259241 A | 9/2003 |
| JP | 2003-318741 A | 11/2003 |
| JP | 2004-64300 A | 2/2004 |

OTHER PUBLICATIONS

"High-Definition Multimedia Interface Specification Version 1.3", Jun. 22, 2006, pp. 1-237, HDMI Licensing, LLC.
Communication from the Japanese Patent Office dated Feb. 7, 2012 in a counterpart application No. 2007-030453.

* cited by examiner

*Primary Examiner* — Scott Baderman
*Assistant Examiner* — Enam Ahmed
(74) *Attorney, Agent, or Firm* — Sughrue Mion, PLLC

(57) ABSTRACT

A signal processing system is provided with a transmitting-side apparatus transmitting a digital signal, and a receiving-side apparatus receiving the digital signal. The transmitting-side apparatus includes a digital signal transmitter transmitting the digital signal and a signal controller controlling the digital signal. The receiving-side apparatus includes a digital signal receiver receiving the digital signal, an error rate detector detecting the error rate of the digital signal received, and a receiving-side controller transmitting error rate data based on the detected error rate to the transmitting-side apparatus. The transmitting-side apparatus further includes a transmitting-side controller receiving the error rate data and controlling the signal controller in response to the error rate data.

12 Claims, 9 Drawing Sheets

SYSTEM AND METHOD FOR DIGITAL SIGNAL TRANSMISSION WITH REDUCED ERROR RATE

This application claims the benefit of priority based on Japanese Patent Application No. 2007-030453, filed on Feb. 9, 2007, the disclosure of which is incorporated herein by reference.

BACKGROUND OF THE INVENTION

1. Field of the Invention

The present invention relates to digital signal transmission, more particularly, to an error rate reduction scheme for digital signal transmission, especially suitable for digital signal transmission based on the High-Definition Multimedia Interface (HDMI) standard or the Unified Display Interface (UDI) standard.

2. Description of the Related Art

As is well known in the art, digital consumer appliances are often designed to support the HDMI standard for digital signal transmission. For example, hard disc recorders often transmit digital signals by using the HDMI standard, and digital televisions often support the HDMI standard for reception of digital signals. In addition, the UDI standard, which is developed as a modified version of the HDMI standard optimized for personal computer monitors, is widely available for general users.

As defined in the High-Definition Multimedia Interface Specification Version 1.3, an HDMI system transmits digital video data across TMDS (Transmission Minimized Differential Signal) channels: three of which are data channels transmitting differential data signals, and one of which is a clock channel transmitting differential clock signals. The allowed maximum clock rate defined in the TMDS standard is 340 MHz, and the allowed maximum transmission band is 10.2 Gbps. Additionally, the HDMI standard defines "data island periods" provided within the blanking periods of the digital video data. The "data island periods" are used to transmit digital audio data or other auxiliary data. The transmitting side may attach error correction codes with the data transmitted during a data island period. The attached error correction codes are used for error correction on the receiving side.

The HDMI standard supports the CEC (consumer electronic control), which is a protocol for remote control of a specific electronic appliance from another electronic appliance; the CEC is implemented as one of the functions of HDMI interface. Additionally, the HDMI standard supports EDIDs (extended Display Identification). In transmitting digital signals to a display device, the transmitting side receives an EDID from the display device and generates the digital signals to be transmitted in accordance with the data reception specification identified by the EDID.

As described above, the HDMI standard is directed to high-frequency large-amount data transmission over a HDMI cable connected between transmitting and receiving sides. The frequency used in the HDMI-based data transmission is extremely high, ten times as high as those used in other digital interfaces used in conventional electric appliances. Therefore, the HDMI standard imposes severe requirements on cables connected between HDMI devices to avoid signal quality deterioration; high quality cables are necessary for HDMI data transmission. For example, HDMI cables are often provided with gold-plated contacts and/or an equalizer. This results in an undesirable increase in the cost. Recently, low quality HDMI cables which are not subjected to a certification test are commercially accepted; however, a low quality HDMI cable may cause errors in audio/video data transmission.

The data errors in audio/video data transmission caused by a low quality HDMI cable include two modes: One error mode is excessive signal attenuation over the HDMI cable, which occurs especially when cheap materials are used for metal contacts and copper wire for cost reduction. The excessive signal attenuation may reduce the voltage amplitude of a signal to be transmitted below a value required by the HDMI standard, and this may cause unsuccessful data reception due to the insufficient voltage amplitude on the receiving side. Another error mode is excessive signal skew caused by uneven lengths of signal lines. The cost reduction in cable manufacture may result in uneven lengths of signal lines within a HDMI cable, causing skew among signals transmitted over the HDMI cable. When signal skew among three data channels and one clock channel exceed maximum skew required by the HDMI standard, the receiving side may unsuccessfully receive data at regular timings.

A user who purchases such a low quality cable and uses the low quality cable for HDMI device connection may suffer from a problem that the receiving side device (such as a digital television) unsuccessfully receive audio and video signal. Such user may misunderstand that the problem results from a defect of the HDMI device, not the low quality MDMI cable. As a result, the use of a low quality cable may cause disadvantage to HDMI device manufacturers. Therefore, further improvement in the quality of signals generated by the transmitting side is required in electric consumer appliances.

Japanese Laid Open Patent Application No. JP-A 2003-259241 discloses a video processing apparatus for error rate reduction. FIG. 1 illustrates a configuration of the disclosed video processing apparatus. The disclosed video processing apparatus is provided with a transmitting apparatus 100 and a receiving apparatus 200 which are connected through interfaces 402 and 403. The transmitting apparatus 100 includes a video signal source 101, an audio signal source 102, an audio/video multiplexer 103, a transmitter circuit 104, a scan converter 106 and a resolution controller 107. The receiving apparatus 200 includes a receiver circuit 201, an audio/video demultiplexer 202, an adder 203, a display device 204, a D-A converter/audio processor 205, a speaker 207, a switch controller 208, an OSD (on-screen display) circuit 209, first and second EDID circuits 211 and 212, switches 213 and 214, a scan converter 215, a memory device 216.

The receiving apparatus 200 receives a digital video signal from the transmitting apparatus 100. The digital video signal received by the receiving apparatus 200 is fed to the switch controller 208 through the audio/video demultiplexer 202. The switch controller 208 detects the error rate of the digital video signal. When the detected error rate is higher than a predetermined threshold value, the switch controller 208 controls the switch 213 so as to select the second EDID circuit 212, which contains format data for low resolution. The selected format data are transmitted to the transmitting apparatus 100 through the interface 403. The transmitting apparatus 100 generates a digital video signal having a reduced scanning ruling and/or a reduced horizontal resolution compared to the digital video signal transmitted just before. This allows the transmitting rate of the data transmitted over the cable, resulting in the reduction of the error rate. The video processing apparatus is also configured to inform the user that the noise on the image displayed on the display device 204 is resulting from the cable quality not the device failure by the on-screen display.

However, the video processing apparatus suffers from a drawback that the video image is not displayed with originally desired resolution, because the transmitting apparatus 100 reduces the resolution of the video image for error rate reduction. The image quality deterioration is not avoided, when the user uses a low quality HDMI cable.

SUMMARY

In an aspect of the present invention, a signal processing system is provided with a transmitting-side apparatus transmitting a digital signal, and a receiving-side apparatus receiving the digital signal. The transmitting-side apparatus includes a digital signal transmitter transmitting the digital signal and a signal controller controlling the digital signal. The receiving-side apparatus includes a digital signal receiver receiving the digital signal, an error rate detector detecting the error rate of the digital signal received, and a receiving-side controller transmitting error rate data based on the detected error rate to the transmitting-side apparatus. The transmitting-side apparatus further includes a transmitting-side controller receiving the error rate data and controlling the signal controller in response to the error rate data.

BRIEF DESCRIPTION OF THE DRAWINGS

The above and other objects, advantages and features of the present invention will be more apparent from the following description of certain preferred embodiments taken in conjunction with the accompanying drawings, in which.

DESCRIPTION OF PREFERRED EMBODIMENTS

There are two causes of errors in transmitting audio and video signals over a low quality HDMI cable, which result in unsuccessful replay of the audio and video data. One cause is excessive attenuation of the audio and video signals over the HDMI cable. The excessive signal attenuation may lead to insufficient voltage amplitude of the audio and video signals on the receiving side, resulting in unsuccessful reception of the audio and video signals. Another cause of the signal errors is excessively large signal skew caused by uneven lengths of TMDS signal lines, which may hinder the receiving side from receiving the audio and video signals at regular timings.

In the following, a description is given of first and second embodiments. The first embodiment is directed to avoid errors caused by signal attenuation over the HDMI cable. On the other hand, the second embodiment is directed to avoid errors caused by signal skew.

Both of the first and second embodiments commonly address the problem of error rate reduction without reducing the resolution of the video image, while offering different measures to deal with this problem. It should be noted that the architectures disclosed in the first and second embodiments are implemented within a single system.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

(First Embodiment)

Figure 1:
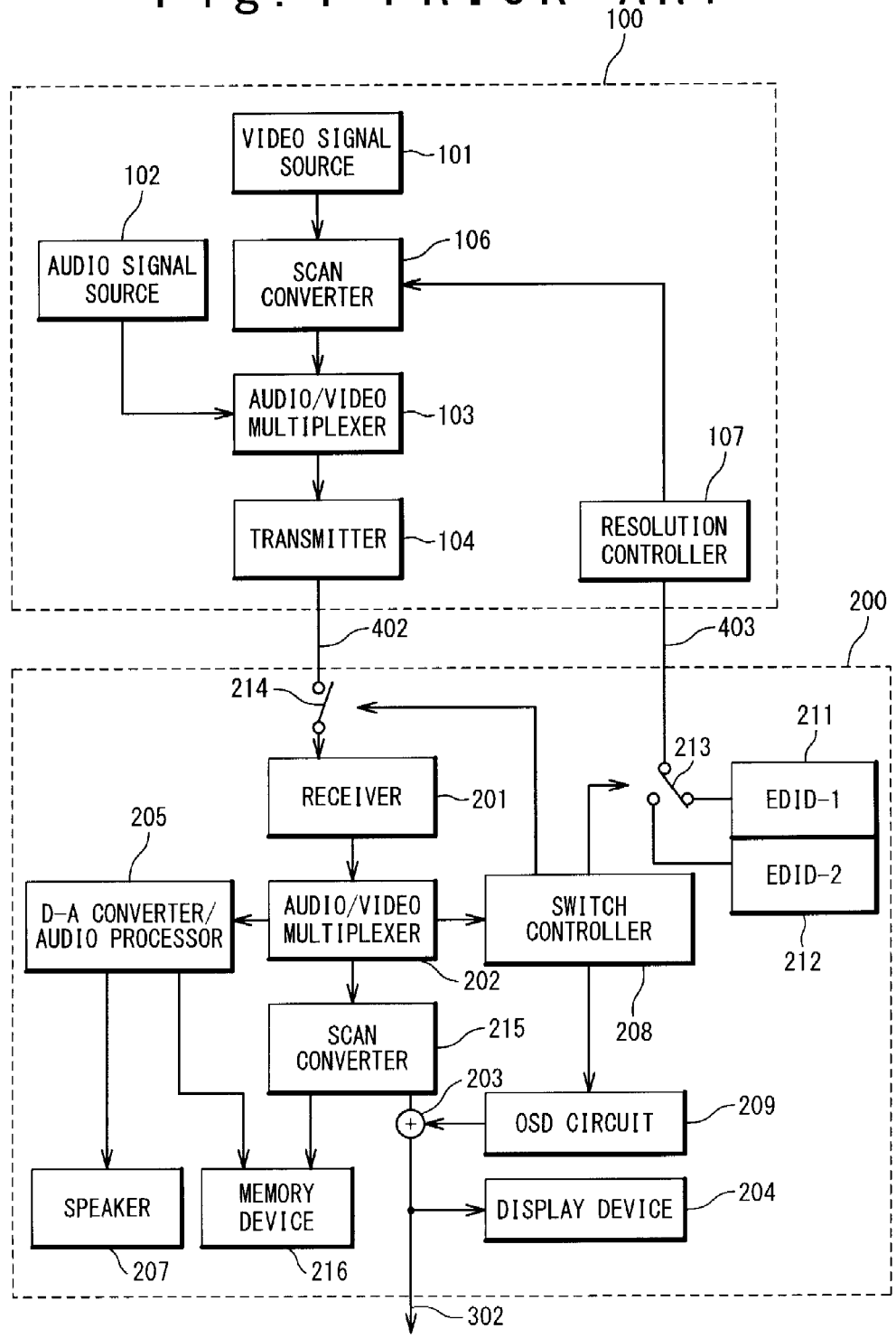
FIG. 1 is a block diagram illustrating a conventional video processing apparatus.
Figure 2:
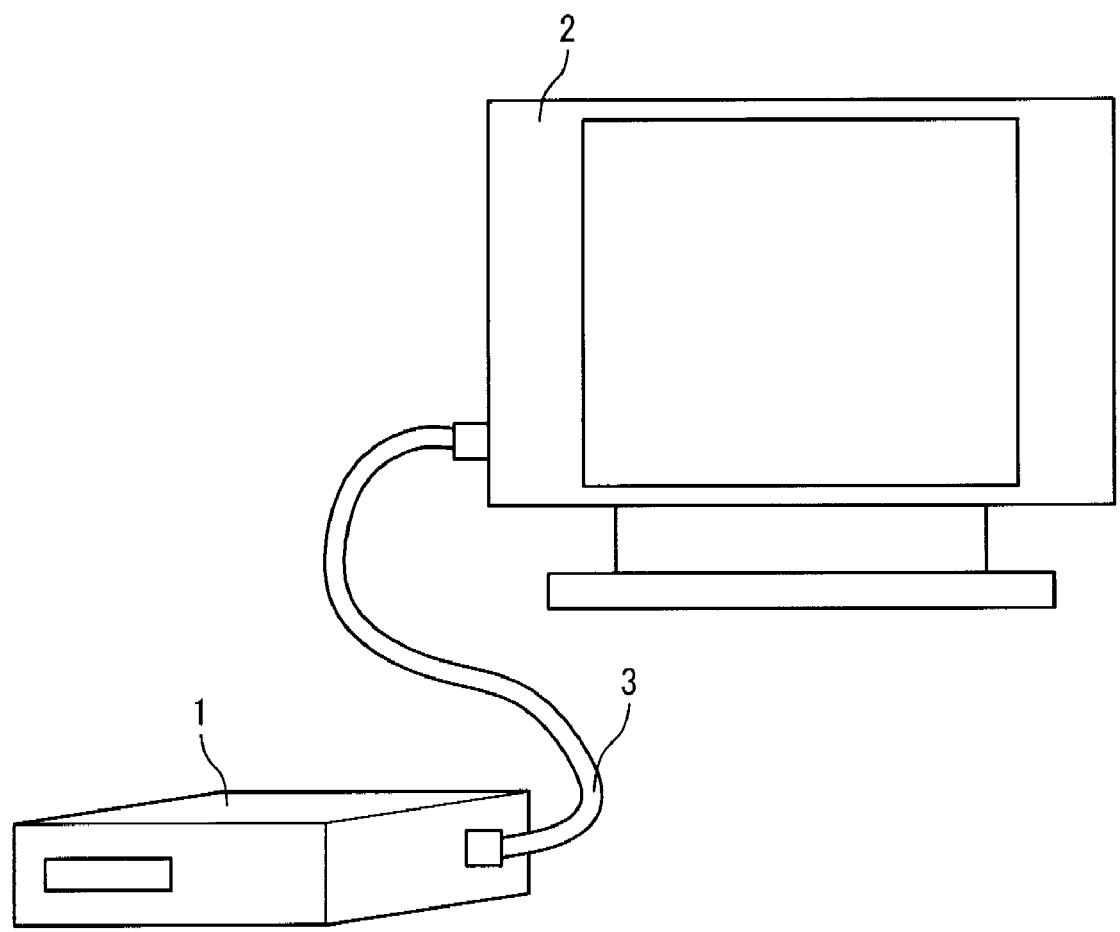
FIG. 2 illustrates an exemplary configuration of a signal processing system in one embodiment of the present invention.
Figure 3:
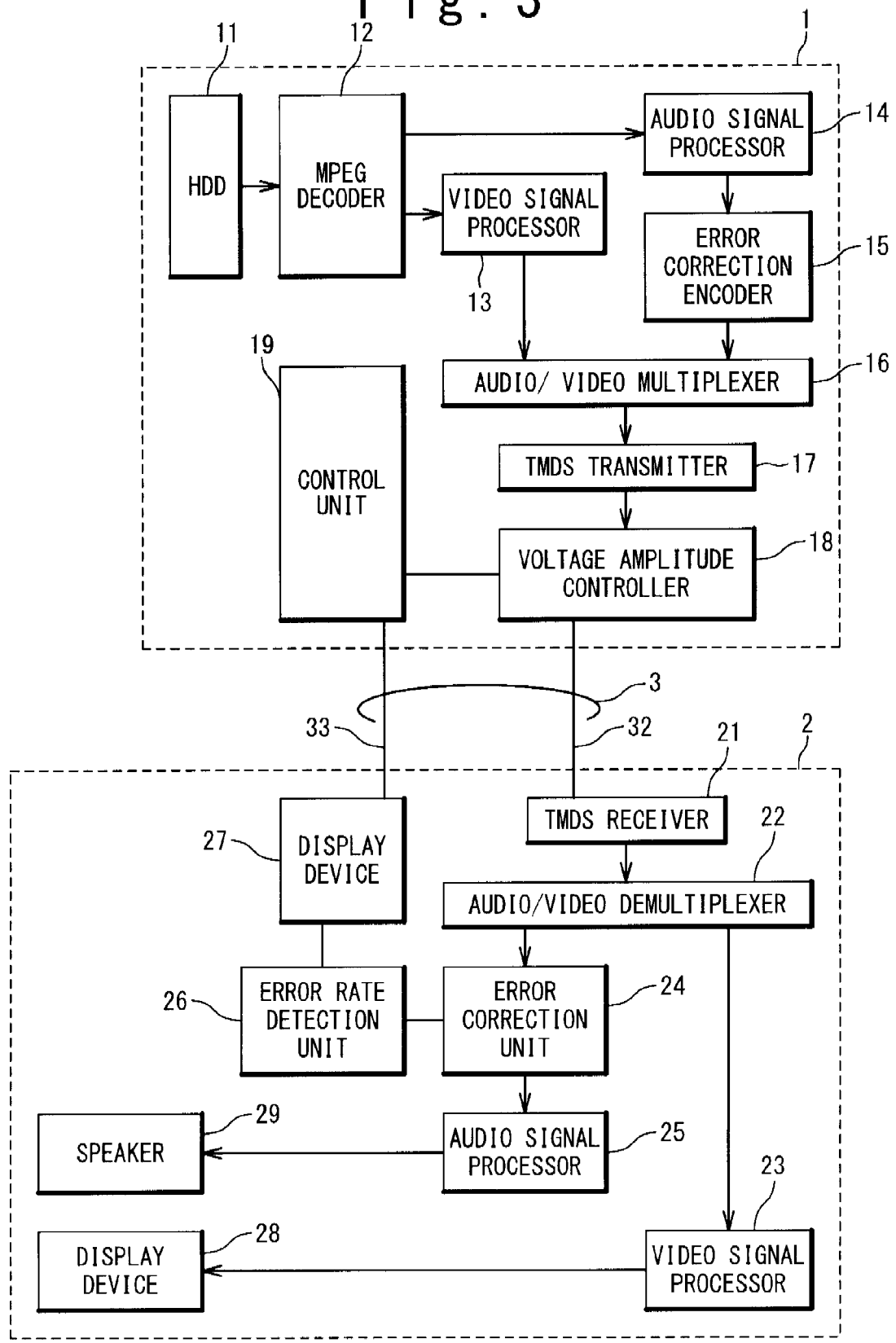
FIG. 3 is a block diagram illustrating an exemplary configuration of a signal processing system in a first embodiment of the present invention.

FIG. 2 illustrates an exemplary overall configuration of a signal processing system of a first embodiment according to the present invention, and FIG. 3 is a block diagram illustrating exemplary configurations of respective apparatuses provided within the system of the first embodiment.

As shown in FIG. 2, a transmitting-side apparatus 1 is connected with a receiving-side apparatus 2 through an HDMI cable 3. In this embodiment, the transmitting-side apparatus 1 is a HDD (hard disc drive) recorder, and the receiving-side apparatus 2 is a digital television. The transmitting-side and receiving-side apparatuses 1 and 2 may be other devices, such as a DVD (digital video disc) player or an audio amplifier.

As shown in FIG. 3, the transmitting-side apparatus 1 is provided with an HDD unit 11, a MPEG decoder 12, a video signal processor 13, an audio signal processor 14, an error correction encoder 15, an audio/video multiplexer 16, a TMDS transmitter 17, a voltage amplitude controller 18, and a transmitting-side control unit 19.

The receiving-side apparatus 2 is provided with a TMDS receiver 21, an audio/video demultiplexer 22, a video signal processor 23, an error correction unit 24, an audio signal processor 25, an error rate detection unit 26, and a receiving-side control unit 27, a display device 28, and a speaker 29.

The HDMI cable 3 is provided with TMDS signal lines 32 and a CEC signal line 33.

The HDD unit 11 is connected with the MPEG decoder 12, and the MPEG decoder 12 is connected with the video signal processor 13 and the audio signal processor 14. The audio signal processor 14 is connected with the error correction encoder 15. The video signal processor 13 and the error correction encoder 15 is connected with the audio/video multiplexer 16. The audio/video multiplexer 16 is connected with the TMDS transmitter 17. The TMDS transmitter 17 is connected with the voltage amplitude controller 18. The voltage amplitude controller 18 is connected with the TMDS receiver 21 through the TMDS signal lines 32. The TMDS receiver 21 is connected with the audio/video demultiplexer 22. The audio/video demultiplexer 22 is connected with the video signal processor 23 and error correction unit 24. The video signal processor 23 is connected with the display device 28. The error correction unit 24 is connected with the audio signal processor 25 and the error rate detection unit 26. The audio signal processor 25 is connected with the speaker 29. The error rate detection unit 26 is connected with the receiving-side control unit 27. The receiving-side control unit 27 is connected with the transmitting-side control unit 19 through the CEC signal line 33. The transmitting-side control unit 19 is connected with the voltage amplitude controller 18.

In the transmitting-side apparatus 1 (that is, the HDD recorder), a MPEG2-TS (moving picture experts group phase 2—transport stream) signal stored in the HDD unit 11 is converted into a digital video signal and a digital audio signal by the MPEG decoder 12. The digital video signal is fed to the video signal processor 13, and the digital audio signal is fed to the audio signal processor 14. The video signal processor 13 and the audio signal processor 14 process the digital video and audio signals in accordance with the signal formats defined in the HDMI standard. For example, the video signal processor 13 changes the resolution of the digital video signal and the audio signal processor 14 adds headers to the digital audio signal. The audio signal processed by the audio signal processor 14 is encoded by the error correction encoder 15, and the encoded audio signal and the video signal are fed to the audio/video multiplexer 16. The audio/video multiplexer 16 multiplexes the audio and video signals during blanking periods of the video signal. The audio/video multiplexed signal is converted into TMDS signals by the TMDS transmitter 17 and the TMDS signals are output to the TMDS signal lines 32 within the HDMI cable 3 through the voltage amplitude controller 18. The voltage amplitude controller 18 operates under the control of the transmitting-side control unit 19.

The TMDS receiver 21 within the receiving-side apparatus 2 (that is, the digital television) receives the TMDS signals from the TMDS signal lines 32. The received TMDS signals are demultiplexed into a video signal and an audio signal by the audio/video demultiplexer 22. The error correction unit 24 provides error correction for the audio signal. When the audio signal suffers from a nonfatal error, the error correction unit 24 detects and corrects the error in the audio signal. The error rate detection unit 26 detects the error rate of the audio signal, monitoring the error detection by the error correction unit 25. The detected error rate is informed to the receiving-side control unit 27. The receiving-side control unit 27 is connected to the control unit 19 of the transmitting-side apparatus 1 through the CEC signal line 33 within the HDMI cable 3. The CEC signal line 33 transfers CEC commands for controlling the counterpart apparatus. The commands transferred may include a command used to turn on the power of the counterpart apparatus, and a command used to instruct the counterpart apparatus to do playback. The video signal output from the audio/video demultiplexer 22 and the audio signal output from the error correction unit 24 are fed to the video signal processor 23 and the audio signal processor 25, respectively. The video signal processor 23 and the audio signal processor 25 provides signal format conversion and digital-analog conversion in accordance with the signal formats adapted to the display device 28 and the speaker 29, allowing displaying desired images on the display device 28 and outputting desired sounds from the speaker 29.

Figure 4:
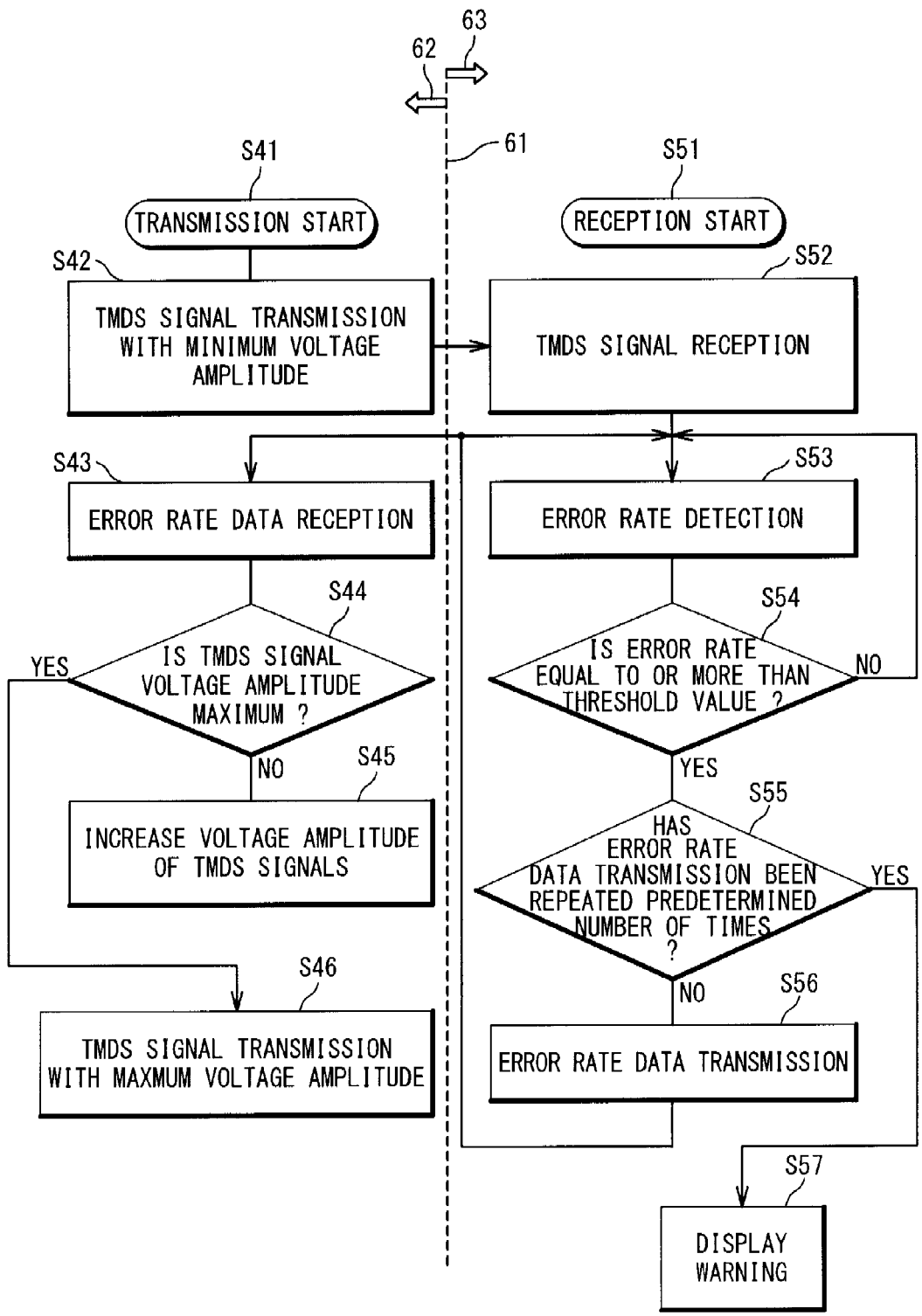
FIG. 4 is a flowchart illustrating an exemplary operation of the signal processing system shown in FIG. 3.
Figure 5:
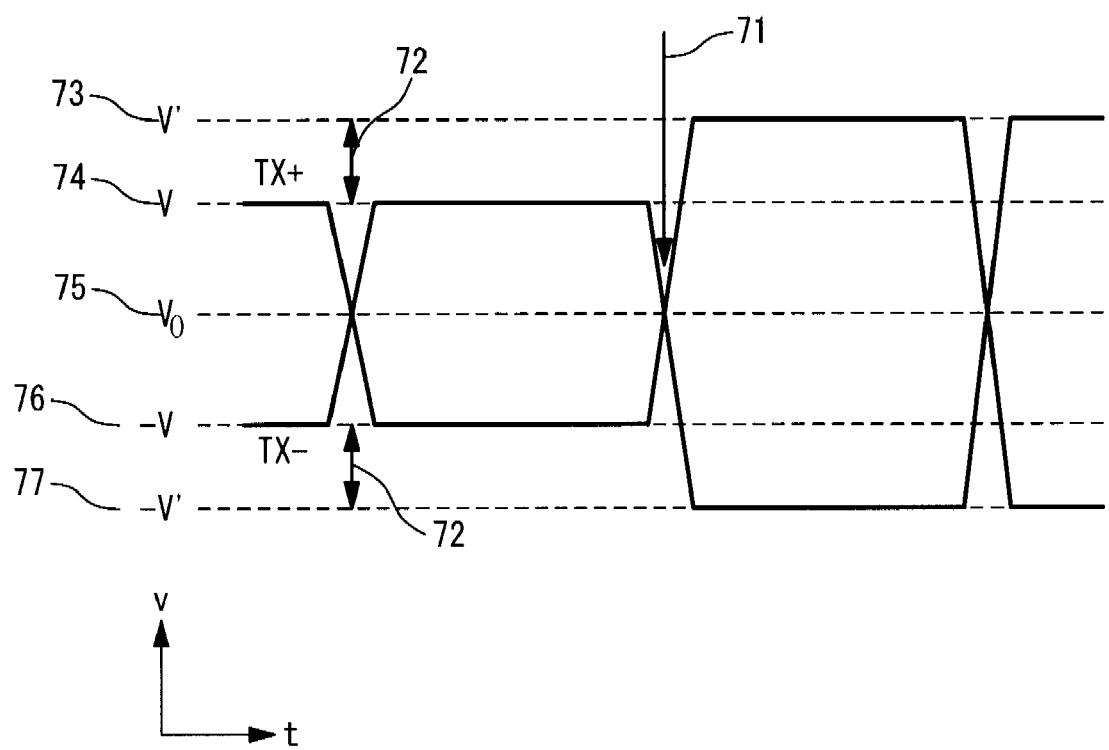
FIG. 5 is a schematic diagram illustrating signal waveforms at the end of the HDMI cable on the transmitting-side in the first embodiment.

FIG. 4 is a flowchart illustrating the operations of the transmitting-side apparatus 1 and the receiving-side apparatus 2 in the first embodiment, and FIG. 5 is a schematic diagram illustrating signal waveforms at the connection end of the HDMI cable 3 to the transmitting-side apparatus 1 in the first embodiment. A description is given of the operations of the transmitting-side apparatus 1 and the receiving-side apparatus 2 in the following with reference to FIGS. 2 to 5.

In FIG. 4, the region 62 on the left side of the dashed line 61 illustrates operation steps implemented within the transmitting-side apparatus 1, and the region 63 on the right side of the dashed line 61 illustrates operation steps implemented within the receiving-side apparatus 2.

Upon the initiation of the digital signal transmission at Step S41, the TMDS transmitter 17 transmits TMDS signals with the allowed minimum voltage amplitude under the control of the voltage amplitude controller 18 at Step S42. The TMDS signal transmission with the minimum voltage amplitude aims to reduce the power consumption. The receiving-side apparatus 2 receives the TMDS signals at step S52. This is followed by error rate detection by the error correction unit 24 and the error rate detection unit 26 at Step S53.

The receiving-side controller 27 then determines at Step S54 whether the detected error rate is equal to or more than a predetermined threshold value. When the detected error rate is less than the threshold value, the procedure goes back to Step S53, and the error rate detection is repeated at Step S53.

When detected error rate is equal to or more than the threshold value, the receiving-side control unit 27 determines whether error rate data transmission has been already repeated a predetermined number of times or more at Step S57. The operation of Step S57 aims to avoid unnecessary repetition of error rate data transmission. When the error rate data transmission has been already repeated a predetermined number of times or more, a warning is on-screen displayed on the display device 28 to inform the user that the video image and sound is not normally replayed because of the poor quality of the HDMI cable, prompting the user to replace the HDMI cable. If not so, the receiving-side controller 27 transmits the error rate data to the transmitting-side control unit 19 within the transmitting-side apparatus 1 through the CEC signal line 33 by using a VSC (vendor specific command) allowed in the CEC specification. The transmitting-side control unit 19 is programmed to correctly interpret the command received from the receiving-side controller 27.

The transmitting-side control unit 19 receives the error rate data at Step S43, noticing the insufficiency of the voltage amplitude. When determining that the voltage amplitude of the TMDS signals has not yet reached the allowed maximum value at Step S44, the transmitting-side control unit 19 sends a command to instruct the voltage amplitude controller 18 to increase the voltage amplitude of the TMDS signals by one voltage step. At Step S45, the voltage amplitude controller 18 increases the voltage amplitude in response to the command received from the transmitting-side control unit 19.

FIG. 5 illustrates exemplary waveforms of a specific pair of the transmitted TMDS signals at the connection end of the HDMI cable 3 to the transmitting-side apparatus 1. More specifically, FIG. 5 illustrates changes over time in the voltage levels of a specific pair of TMDS signals. It should be noted that other TMDS signal pairs exhibit similar changes over time. The bias voltage of the TMDS signals is referred to as V0 in FIG. 5.

In the operation example shown in FIG. 5, the voltage amplitude of the TMDS signals is increased at a time 71. The voltage amplitude is ±V (denoted by the numerals 74 and 76) before the time 71, and the voltage amplitude is ±V' (denoted by the numerals 73 and 77) after the time 71. The voltage amplitude is increased by the difference 72 between the voltage amplitudes before and after the time 71 (that is, V'-V).

When the voltage drop across the TMDS signal lines 32 within the HDMI cable 3 is smaller than V'-V (denoted by the numeral 72), the increase in the voltage amplitude of the TMDS signals probably reduces the error rate on the receiving-side apparatus 2 below the predetermined threshold level. It should be noted that this discussion is based on the assumption that the errors are mainly caused by the voltage level attenuation.

After the error rate is decreased below the predetermined threshold level, the receiving-side apparatus 2 stops transmitting the error rate data at Step S56, and accordingly, the transmitting-side apparatus 1 stops increasing the voltage amplitude at Step S45; the voltage amplitude controller 18 transmits the TMDS signals with the voltage amplitude thereof unchanged.

When the voltage drop across the TMDS signal lines 32 within the HDMI cable 3 is larger than V'-V (denoted by the numeral 72), the error rate on the receiving-side apparatus 2 may be still larger than the predetermined threshold level. In this case, the error rate data are repeatedly transmitted to the transmitting-side apparatus 1 at Step S56. The transmitting-aide apparatus 1 repeatedly performs the operations of Step S43 to 45, until the error rate is decreased below the predetermined threshold level or until the voltage amplitude is determined as being the allowed maximum value at Step S44. When the voltage amplitude is determined as being the allowed maximum value at Step S44, the voltage amplitude controller 18 transmits the TMDS signals with the allowed maximum voltage amplitude at Step S46.

The advantage of the system of the first embodiment is as follows: The conventional technique described above reduces the errors of the transmitted signals by decreasing the resolution of the video signal transmitted by the transmitting apparatus, when the receiving apparatus cannot successfully receive the data and thereby cannot successfully replay the video image and sound, because of signal errors caused by the excessive voltage amplitude attenuation of the audio and video signals over a low quality HDMI cable connected between the transmitting and receiving apparatuses. The system of this embodiment, on the other hand, increases the voltage amplitude of the TMDS signals output from the transmitting-side apparatus 1 in such situation and thereby reduces the errors of the TMDS signals caused by the voltage amplitude attenuation over the HDMI cable 3. This allows effectively reducing the disturbance of the video images and sounds without reducing the resolution.

In order to obtain such advantage, the receiving-side apparatus 2 of this embodiment is provided with means for calculating the error rate of signals transmitted in accordance with the HDMI standard, and means for transmitting a CEC command up to a predetermined number of times to provide the error rate data for the transmitting-side apparatus 1, when the error rate exceeds a predetermined threshold value. The transmitting-side apparatus 1 is provided with means for receiving the CEC command incorporating the error rate data, and means for controlling the voltage amplitude of the TMDS signals transmitted to the receiving-side apparatus 2 in response to the error rate data.

When the error rate exceeds a predetermined threshold value, the receiving-side apparatus 2 transmits the CEC command incorporating the error rate data to the transmitting-side apparatus 1. The transmitting-side apparatus 1 increases the voltage amplitude of the TMDS signals by using the amplitude control means provided therein.

This results in that the transmitting-side apparatus 1 outputs the TMDS signals onto the TMDS signal lines 32 within the HDMI cable 3 with a voltage amplitude higher than the normally-used voltage amplitude and that the TMDS signals are transmitted with the voltage amplitude controlled so as to compensate the voltage attenuation caused by the poor quality of the HDMI cable. Therefore, the system of this embodiment effectively reduces the error rate of the TMDS signals received by the receiving-side apparatus 2, improving the disturbance of video images and sounds without decreasing the resolution of the video images.

(Second Embodiment)

Figure 7:
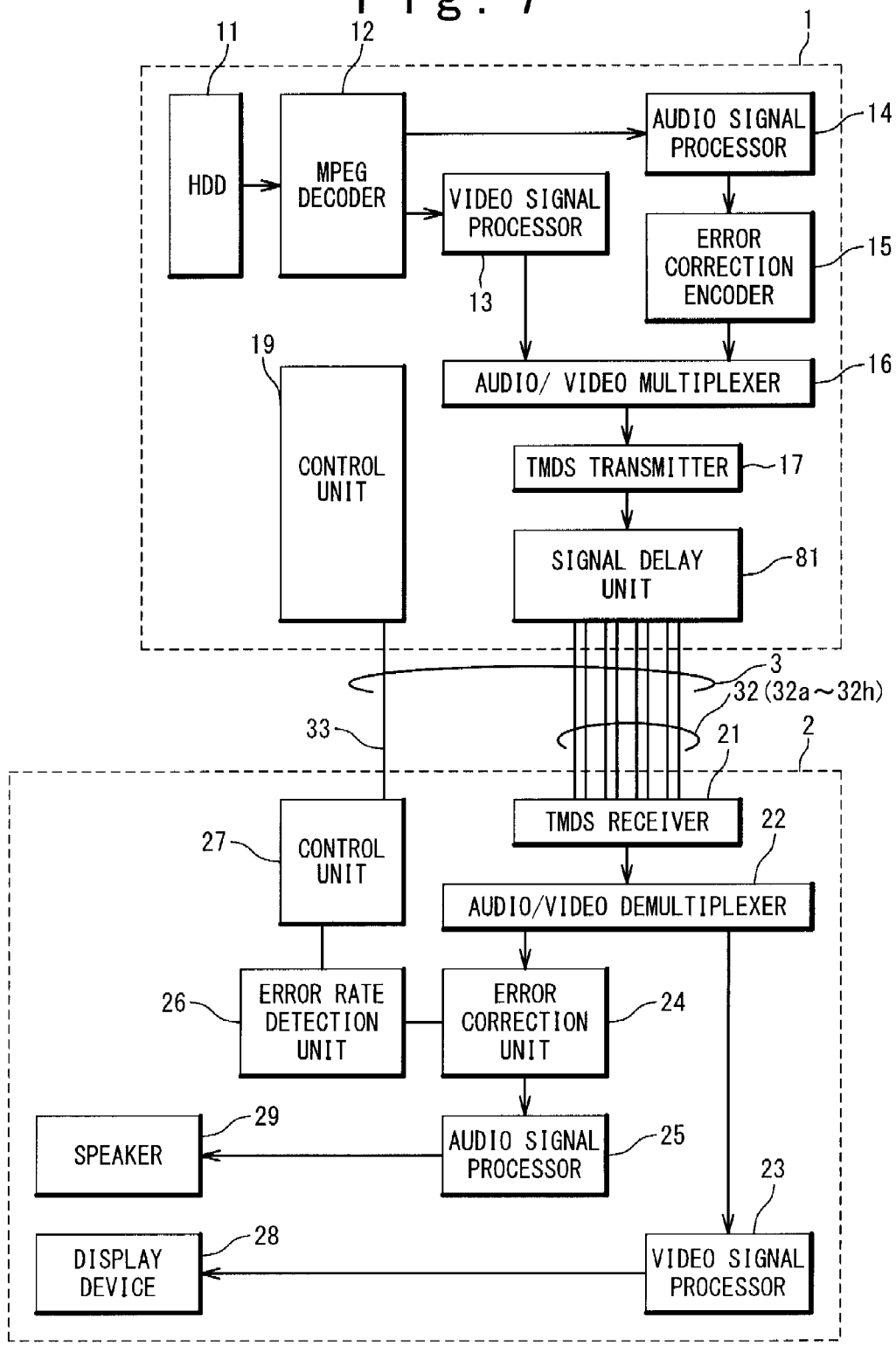
FIG. 7 is a block diagram illustrating an exemplary configuration of a signal processing system in a second embodiment of the present invention.

FIG. 7 is a block diagram illustrating exemplary configurations of the transmitting-side and receiving-side apparatuses 1 and 2. In FIG. 7, the same numerals as those in FIGS. 2 and 3 denote the same components and detailed description thereof are not given for simplicity.

In the second embodiment, a signal delay unit 81 is provided within the transmitting-side apparatus 1 instead of the voltage amplitude controller 18 of the first embodiment. As described below, the operation of the signal delay unit 81 effectively reduces the error rate of the TMDS signals received by the receiving-side apparatus 2.

Figure 6:
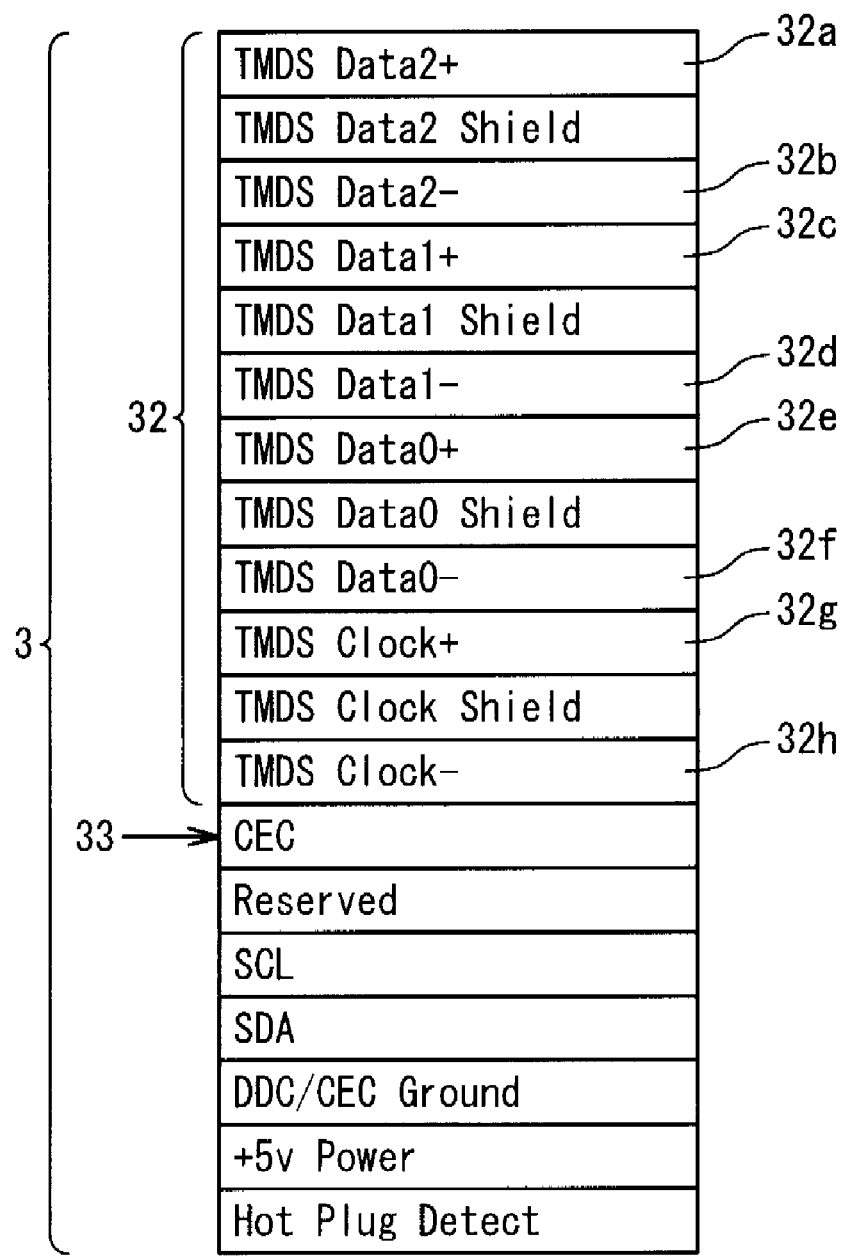
FIG. 6 is a list of signal lines provided within an HDMI cable.

FIG. 6 illustrates respective signal lines provided within the HDMI cable 3. As shown in FIG. 6, the TMDS signal lines 32 includes eight TMDS signal lines 32a to 32h and four TMDS shield lines. The eight TMDS signal lines 32a to 32h constitute four pairs of differential signal lines. The TMDS signal lines 32a and 32b are paired to provide the TMDS data channel "2", and the TMDS signal lines 32c and 32d are paired to provide the TMDS data channel "1". Correspondingly, the TMDS signal lines 32e and 32f are paired to provide the TMDS data channel "0", and the TMDS signal lines 32g and 32h are paired to form yet still another pair of differential signal lines to provide the TMDS clock channel.

In this embodiment, the signal delay unit 81 is designed to individually provide predetermined delay for each differential signal pair transmitted over each pair of the differential signal lines. In other words, the signal delay unit 81 is designed to provide skews among the four differential signal pairs. In this embodiment, the signal delay unit 81 is designed to provide the same delay for two differential signals of the same differential signal pair. It should be noted, however, that the signal delay unit 81 may be designed to provide a predetermined delay for each of the two differential signals of each differential signal pair. That is, the signal delay unit 81 may be allowed to provide skew between the differential signals of the same differential signal pair. Furthermore, the signal delay unit 81 may be adapted to control the length of the delay in a step-by-step manner.

Figure 8:
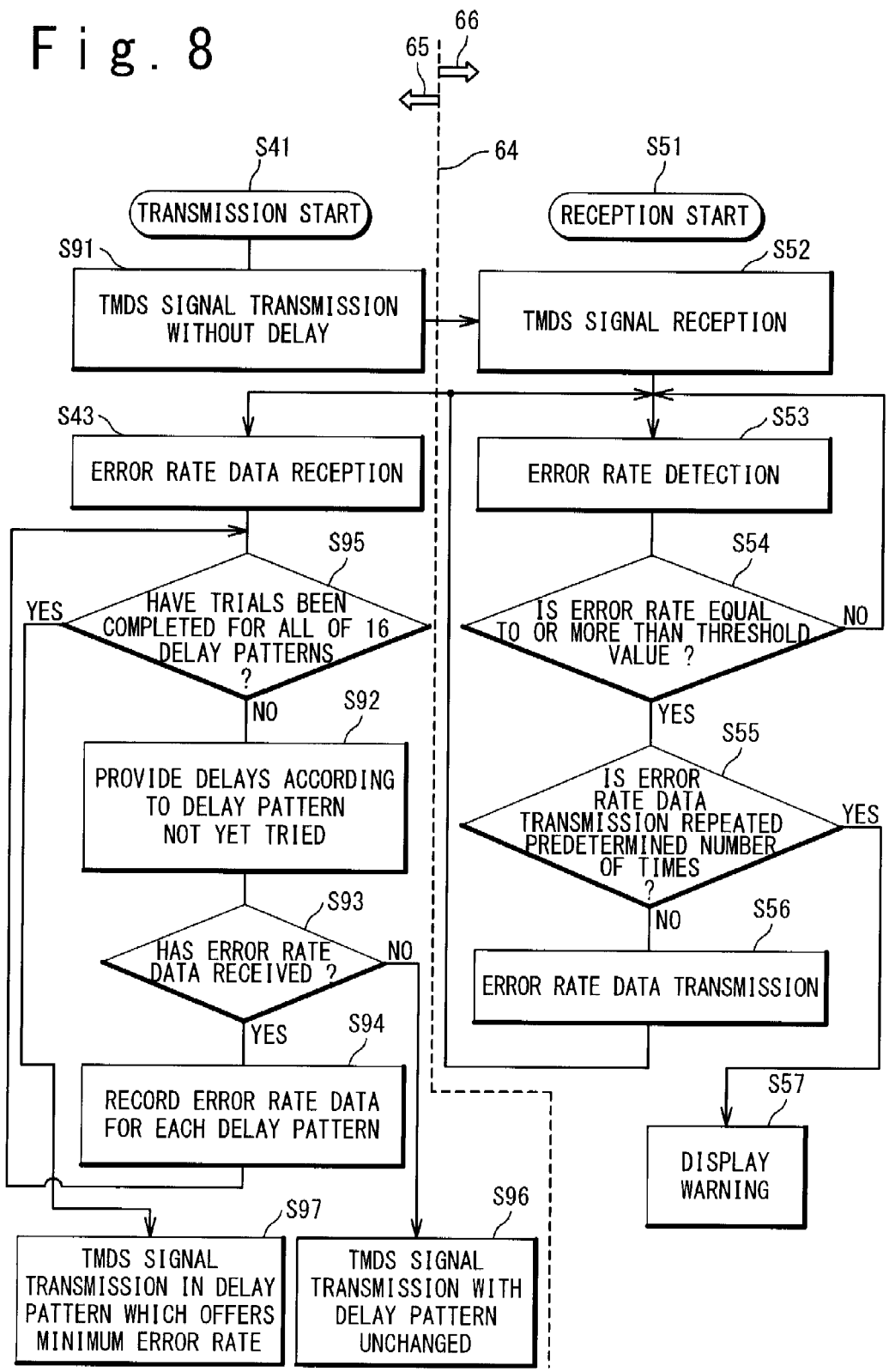
FIG. 8 is a flowchart illustrating an exemplary operation of the signal processing system shown in FIG. 7.
Figure 9:
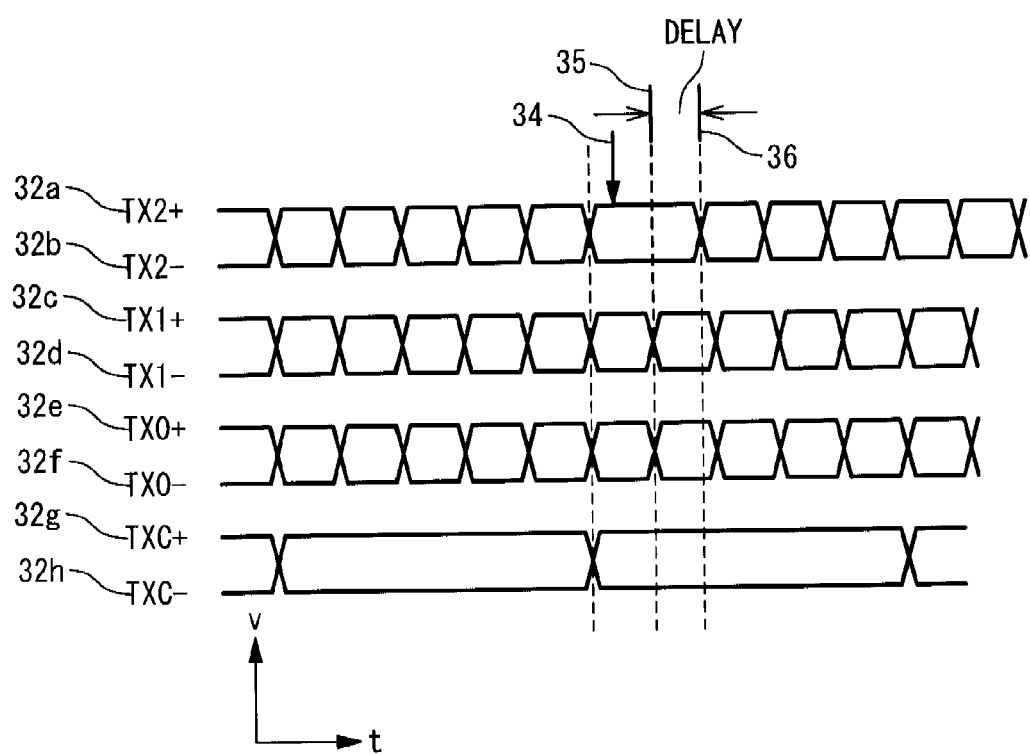
FIG. 9 is schematic diagram illustrating signal waveforms at the end of the HDMI cable on the transmitting-side in the second embodiment.

FIG. 8 is a flowchart illustrating exemplary operations of the transmitting-side and receiving-side apparatuses 1 and 2 in the second embodiment, and FIG. 9 is a schematic diagram illustrating signal waveforms at the connection end of the HDMI cable 3 to the transmitting-side apparatus 1 in the second embodiment. A description is given of the operations of the transmitting-side apparatus 1 and the receiving-side apparatus 2 in the following with reference to FIGS. 6 to 9. In FIG. 9, the same numerals as those in FIGS. 4 denote the same operation steps and detailed description thereof are not given for simplicity.

In FIG. 8, the region 65 on the left side of the dashed line 64 illustrates operation steps implemented within the transmitting-side apparatus 1, and the region 66 on the right side of the dashed line 64 illustrates operation steps implemented within the receiving-side apparatus 2.

The operation of the receiving-side apparatus 2 (illustrated in the region 66) in the second embodiment is same as that in the first embodiment, and therefore a detailed description thereof is not given for simplicity.

At Step S91, the transmitting-side apparatus 1 transmits the TMDS signals to the receiving-side apparatus 2 without providing delay in the signal delay unit 81. When the error rate data are transmitted from the receiving-side control unit 27 of the receiving-side apparatus 2 through the CEC signal line 33, the transmitting-side control unit 19 of the transmitting-side apparatus 1 receives the error rate data at Step S43, deciding that the TMDS signal lines 32 causes signal skew at the receiving-side apparatus 2.

At Steps S92 to S95, the transmitting-side apparatus 1 optimally provides delay for selected one(s) of the four differential signal pairs transmitted over the TMDS signal lines 32, and thereby cancels the signal skew.

There are sixteen delay patterns in providing delay for the four differential signal pairs. There are two possible ways in providing delay for the differential signal pair transmitted over the TMDS signal lines 32a and 32b; the differential signal pair transmitted over the TMDS signal lines 32a and 32b may be delayed by a predetermined delay time or not. The same goes for the remaining three differential signal pairs. Therefore, the total number of combinations allowed for the four differential signal pairs is sixteen. Strictly speaking, the number of allowed delay patterns should be considered as fifty, because providing delay for all of the four differential signal pairs is practically equivalent to providing no delay for any of the four differential signal pairs. The transmitting-side apparatus 1 selects one offering the minimum skew out of the allowed delay patterns.

In detail, when determining any of the allowed delay pattern as having not yet been tried at Step S95, the transmitting-side control unit 19 sends a command indicating the signal delay unit 81 to provide delay for the four differential signal pair in accordance with the delay pattern not yet tried. In response to the command received from the transmitting-side control unit 19, the signal delay unit 81 provides predetermined delay for the differential signal pair(s) indicated by the received command, and transmits the four differential signal pairs to the receiving-side apparatus 2.

FIG. 9 is a timing chart illustrating the signal waveforms of the four differential signal pairs at the connection end of the HDMI cable 3 to the transmitting-side apparatus 1, for the case that the command transmitted from the transmitting-side control unit 19 to the signal delay unit 81 indicates a delay pattern in which the signal delay unit 81 provides the delay for only the differential signal pair transmitted over the TMDS signal lines 32a and 32b, which function as the TMDS data channel "2". In the operation shown in FIG. 9, the signal delay unit 81 provides predetermined delay for the differential signal pair transmitted over the TMDS signal lines 32a and 32b after the time 34. The phase of the differential signal pair transmitted over the TMDS signal lines 32a and 32b (that is, the TMDS data channel "2") at the time 36 is identical to the phases of the remaining differential signal pairs transmitted over the TMDS signal lines 32c to 32h (that is, the TMDS data channels "1" and "0" and the TMDS clock channel) at the time 35. Providing delay for the differential signal pair transmitted over the TMDS signal lines 32a and 32b effectively reduces the signal skew and thereby reduces the error rate of the TMDS signals received by the receiving-side apparatus 2, when the TMDS signal lines 32a and 32b, which provides have a length shorter than those of the remaining TMDS signal lines 32c to 32h, causing the skew of the differential signal pair of the TMDS data channel "2" with respect to the other channels; the skew is eliminated, when the length of the delay is appropriately determined in accordance with the relation between the TMDS signal line lengths and the signal transmission rate so as to follow the equation:

(Delay Time)=(Difference in Signal Line Length)/(Signal Transmission Rate).

It should be noted that this discussion is based on the assumption that the signal errors are mainly caused by the skew resulting from the difference in the length of the TMDS signal lines 32 within the HDMI cable 3.

After the delay is given in accordance with the untried delay pattern selected out of the sixteen allowed delay patterns at Steps S92, the procedure goes to Step S93. When the error rate data are not transmitted from the receiving-side apparatus 2 at Step S93, the signal delay unit 81 continues to transmit the TMDS signals in accordance with the delay pattern for which the error rate data are not received.

When the error rate data are received at Step S92, the transmitting-side control unit 19 determines that the delay is not appropriately provided for the differential signal pairs, and records therein the error rate data for the current delay pattern. The procedure then goes to Steps S95.

Steps S92 to S95 are repeated until the error rate data stop being transmitted to the transmitting-side apparatus 1 or until all the sixteen delay patterns have been tried. When all the sixteen delay patterns are determined as having been tried at Step S 95, the transmitting-side control unit 19 determines the delay pattern that offers the minimum error rate on the basis of the error rate data for the sixteen delay patterns recorded at Step S94, and instructs the signal delay unit 81 to provide delay in accordance with the delay pattern that offers the minimum error rate.

The advantage of the system of the second embodiment is as follows: The conventional technique described above reduces the errors of the transmitted signals by decreasing the resolution of the video signal transmitted by the transmitting apparatus, when the receiving apparatus cannot successfully receive the data and thereby cannot successfully replay the video image and sound, because of signal errors caused by the signal skews resulting from the difference in the lengths of the TMDS signal lines within a low quality HDMI cable connected between the transmitting and receiving apparatuses. In the system of this embodiment, on the other hand, the transmitting-side apparatus 1 selects one of the allowed delay patterns so that the selected delay pattern reduces the error rate below a predetermined value on the receiving-side apparatus 2 or so that the selected delay pattern offers the minimum error rate, and transmits the TMDS signals with the selected delay pattern. This effectively reduces the signal skew caused by the difference in the lengths of the TMDS signal lines 32, allowing reducing the disturbance of the video images and sounds without reducing the resolution.

In order to obtain such advantage, the receiving-side apparatus 2 of this embodiment is provided with means for calculating the error rate of signals transmitted in accordance with the HDMI standard, and means for transmitting a CEC command up to a predetermined number of times to provide the error rate data for the transmitting-side apparatus 1, when the error rate exceeds a predetermined threshold value. The transmitting-side apparatus 1 is provided with means for receiving the CEC command incorporating the error rate data, and means for providing delay for the TMDS differential signal pairs transmitted to the transmitting-side apparatus 1 over the TMDS signal lines 32 in response to the error rate data.

When the error rate exceeds a predetermined threshold value, the receiving-side apparatus 2 transmits the CEC command incorporating the error rate data to the transmitting-side apparatus 1. The transmitting-side apparatus 1 sequentially tries the allowed delay patterns in providing delay for the respective four TMDS differential signal pairs, by using the signal delay means provided therein.

The transmitting-side apparatus 1 transmits the TMDS differential signal pairs in accordance with the delay pattern selected so that the selected delay pattern reduces the error rate below a predetermined value on the receiving-side apparatus 2 or so that the selected delay pattern offers the minimum error rate. This result in that the TMDS differential signal pairs are transmitted with the delay compensating the signal skew caused by the difference in the lengths of the TMDS signal lines 32 within a low quality HDMI cable. Therefore, the system of the second embodiment effectively reduces the error rate of the signals received by the receiving-side apparatus 2, allowing reducing the disturbance of the video images and sounds without reducing the resolution.

It is apparent that the present invention is not limited to the above embodiments, but may be modified and changed without departing from the scope of the invention. It should be especially noted that the present invention is applicable to a system in which the UDI standard is used for the digital data transmission. In this case, both of the transmitting-side and receiving-side apparatuses 1 and 2 are designed to support the UDI standard.

What is claimed is:

1. A signal processing system comprising:
 a transmitting-side apparatus transmitting a digital signal; and
 a receiving-side apparatus receiving said digital signal and coupled to the transmitting side apparatus through an HDMI cable,
 wherein said transmitting-side apparatus includes:
  a digital signal transmitter transmitting said digital signal; and
  a signal controller controlling said digital signal,
 wherein said receiving-side apparatus includes:
  a digital signal receiver receiving said digital signal;
  an error rate detector detecting an error rate of said digital signal received;
  a receiving-side controller transmitting error rate data based on said detected error rate to said transmitting-side apparatus when said detected error rate is equal to or more than a predetermined threshold value whereas the receiving-side controller does not transmit said error rate data to said transmitting-side apparatus when said detected error rate is less than the predetermined threshold value; and
  a display device displaying a warning on screen which indicates that video image and sound are not normally replayed because of a poor quality of the HDMI cable when the transmitting error rate data has been already repeated a predetermined number of times or more, and
 wherein said transmitting-side apparatus further includes a transmitting-side controller receiving said error rate data and controlling said signal controller based on said error rate data.

2. The signal processing system according to claim 1, wherein said signal controller controls the voltage amplitude of said digital signal.

3. The signal processing system according to claim 1, wherein said signal controller controls delay of said digital signal.

4. The signal processing system according to claim 1, wherein both of said transmitting-side and receiving-side apparatuses are designed to support the HDMI standard.

5. The signal processing system according to claim 1, wherein both of said transmitting-side and receiving-side apparatuses are designed to support the UDI standard.

6. The signal processing system according to claim 4, wherein said digital signal is a TMDS signal.

7. The signal processing system according to claim 4, wherein said error rate data is transmitted from said receiving-side apparatus to said transmitting-side apparatus in a form of a CEC command.

8. A receiving-side apparatus comprising:
 a digital signal receiver receiving a digital signal from a transmitting-side apparatus to be coupled to the receiving-side apparatus through an HDMI cable;
 an error rate detector detecting an error rate of said digital signal received;
 a receiving-side controller transmitting error rate data based on said detected error rate to said transmitting-side apparatus when said detected error rate is equal to or more than a predetermined threshold value whereas the receiving-side controller does not transmit said error rate data to said transmitting-side apparatus when said detected error rate is less than the predetermined threshold value; and
 a display device displaying a warning on screen which indicates that video image and sound are not normally replayed because of a poor quality of the HDMI cable when the transmitting error rate data has been already repeated a predetermined number of times or more.

9. The receiving-side apparatus according to claim 8, wherein said error rate data includes data used for voltage amplitude control of said digital signal within said transmitting-side apparatus.

10. The receiving-side apparatus according to claim 8, wherein said error rate data includes data used for delay control of said digital signal within said transmitting-side apparatus.

11. The receiving-side apparatus according to claim 8, wherein said receiving-side apparatus is designed to support the HDMI standard.

12. The receiving-side apparatus according to claim 8, wherein said receiving-side apparatus is designed to support the UDI standard.

* * * * *